United States Patent
Li (10) Patent No.: US 9,606,566 B2
(45) Date of Patent: Mar. 28, 2017

(54) TRANS-CONDUCTANCE REGULATION CIRCUIT, TRANS-CONDUCTANCE ERROR AMPLIFIER AND POWER CONVERTER

(71) Applicant: Chengdu Monolithic Power Systems Co., Ltd., Chengdu (CN)

(72) Inventor: Lei Li, Chengdu (CN)

(73) Assignee: CHENGDU MONOLITHIC POWER SYSTEMS CO., LTD., Chengdu (CN)

(*) Notice: Subject to any disclaimer, the term of this patent is extended or adjusted under 35 U.S.C. 154(b) by 77 days.

(21) Appl. No.: 14/788,478

(22) Filed: Jun. 30, 2015

(65) Prior Publication Data

US 2015/0378386 A1 Dec. 31, 2015

(30) Foreign Application Priority Data

Jun. 30, 2014 (CN) .......................... 2014 1 0305119

(51) Int. Cl.
| | |
|---|---|
| H02M 3/156 | (2006.01) |
| G05F 3/26 | (2006.01) |
| H03F 1/34 | (2006.01) |
| H03F 3/217 | (2006.01) |
| H03F 3/45 | (2006.01) |
| H02M 3/158 | (2006.01) |
| H02M 1/00 | (2006.01) |

(52) U.S. Cl.
CPC .............. *G05F 3/267* (2013.01); *H03F 1/34* (2013.01); *H03F 3/2171* (2013.01); *H03F 3/4508* (2013.01); *H02M 3/158* (2013.01); *H02M 2001/0003* (2013.01); *H03F 2200/351* (2013.01); *H03F 2200/45* (2013.01); *H03F 2203/45112* (2013.01); *H03F 2203/45116* (2013.01); *H03F 2203/45676* (2013.01)

(58) Field of Classification Search
CPC .............................. H02M 3/156; H02M 3/157
USPC ................................................. 323/282, 283
See application file for complete search history.

(56) References Cited

U.S. PATENT DOCUMENTS

| | | | | |
|---|---|---|---|---|
| 5,939,867 A * | 8/1999 | Capici ..................... | G05F 1/565 |
| | | | | 323/277 |
| 6,157,176 A * | 12/2000 | Pulvirenti ............... | G05F 1/565 |
| | | | | 323/266 |
| 6,362,605 B1 * | 3/2002 | May ...................... | H02J 7/0065 |
| | | | | 323/265 |
| 2005/0285580 A1 * | 12/2005 | Chen ..................... | H02M 3/156 |
| | | | | 323/282 |
| 2011/0148381 A1 * | 6/2011 | Kwan ................... | H02M 3/156 |
| | | | | 323/285 |

(Continued)

*Primary Examiner* — Jeffrey Sterrett (57) ABSTRACT

A trans-conductance regulation circuit, a trans-conductance error amplifier module and a power converter. The trans-conductance regulation circuit provides a bias current at least partially based on an output voltage of the power converter. The bias current is sent to bias a trans-conductance operational amplifier in the trans-conductance error amplifier module so that a trans-conductance of the trans-conductance operational amplifier is direct proportional to the output voltage of the power converter. The power converter regulates the output voltage based on a negative feedback loop comprising the trans-conductance error amplifier module. The trans-conductance error amplifier module may help to maintain a band width of the negative feedback loop substantially stable and immune to variations in the output voltage.

15 Claims, 4 Drawing Sheets

(56) References Cited

U.S. PATENT DOCUMENTS

2011/0309808 A1* 12/2011 Zanchi .................... G05F 3/262
   323/282
2013/0308061 A1* 11/2013 Murakami .......... H02M 3/1582
   348/730
2015/0378386 A1* 12/2015 Li ........................ H03F 3/2171
   323/315

* cited by examiner

TRANS-CONDUCTANCE REGULATION CIRCUIT, TRANS-CONDUCTANCE ERROR AMPLIFIER AND POWER CONVERTER

CROSS-REFERENCE TO RELATED APPLICATION(S)

This application claims the benefit of CN Application No. 201410305119.X filed on Jun. 30, 2014 and incorporated herein by reference.

TECHNICAL FIELD

This disclosure relates generally to power converters, and more particularly but not exclusively relates to switching power converters and error amplifier of switching power converters.

BACKGROUND

Switching power converters generally comprise a control module for controlling a switch module to switch on and off so as to convert an input voltage into an appropriate output voltage to supply a load.

Normally, the control module is configured to control the on and off switching of the switch module based on a feedback signal indicative of the output voltage and a reference signal indicative of a desired value of the output voltage, so that the control module can regulate the output voltage in response to changes in the load. A negative feedback control loop is thus established. The reference signal is predetermined and generally provided by an internal reference generation circuit e.g. a bandgap reference circuit. The feedback signal can be provided by a feedback circuit configured to sense the output voltage of the power converter with a feedback coefficient. The negative feedback control loop is aimed to regulate the feedback signal to track the reference signal based on a difference between the feedback signal and the reference signal so as to maintain the output voltage at the desired value.

Typically, an error amplifier is utilized to conduct operation to the feedback signal and the reference signal so as to provide the difference between the feedback signal and the reference signal. Trans-conductance error amplifier is one type of the most often used error amplifiers, a trans-conductance of which can be determined by a ratio of a bias current provided to the trans-conductance error amplifier to a thermal voltage. The bias current is normally substantially constant and the thermal voltage is also constant. Thus, the trans-conductance is substantially constant. For a switching power converter using a trans-conductance error amplifier, a band width of the negative feedback loop may decrease with increase in the desired value of the output voltage. This is because the band width is in direct proportion with the feedback coefficient of the feedback circuit. Providing that the reference signal is predetermined, should the desired value of the output voltage decrease, the feedback coefficient should be decreased accordingly. However, in practical application, it is desired that the band width of the negative feedback loop does not decrease with the increase in the desired value of the output voltage.

SUMMARY

In accomplishing the above and other objects, there has been provided, in accordance with an embodiment of the present disclosure, trans-conductance regulation circuit for regulating a trans-conductance of a trans-conductance operational amplifier in a power converter, wherein the power converter is configured to convert an input voltage into an output voltage, and wherein the trans-conductance operational amplifier has a bias current input terminal configured to receive a bias current, and wherein the trans-conductance is determined by a ratio of the bias current to a substantially constant thermal voltage. The trans-conductance regulation circuit may have a first input terminal configured to receive the output voltage of the power converter may be configured to convert the output voltage to the bias current with a predetermined conversion factor. In this circumstance, the trans-conductance of the trans-conductance operational amplifier is direct proportional to the output voltage, and thus the output voltage as numerator in the trans-conductance can counteract with the output voltage as denominator in a feedback coefficient of a feedback signal to the output voltage. Consequently, a negative feedback loop comprising the trans-conductance operational amplifier may have a loop band width substantially immune to variations in the output voltage.

There has also been provided, in accordance with an embodiment of the present disclosure, a trans-conductance error amplifier module for a power converter, wherein the power converter is configured to convert an input voltage into an output voltage. The trans-conductance error amplifier module may comprise a trans-conductance operational amplifier having a bias current input terminal configured to receive a bias current and a trans-conductance determined by a ratio of the bias current to a substantially constant thermal voltage; and a trans-conductance regulation circuit having a first input terminal configured to receive the output voltage of the power converter and an output terminal configured to provide the bias current to the trans-conductance operational amplifier, wherein the trans-conductance regulation circuit is configured to convert the output voltage to the bias current with a predetermined conversion factor.

In accordance with an exemplary embodiment, the trans-conductance regulation circuit may further have a second input terminal configured to receive a feedback signal indicative of the output voltage of the power converter. The trans-conductance regulation circuit may be configured to provide a first current based on a difference between the output voltage and the feedback signal, and further configured to provide a second current based on the feedback signal, and further configured to generate the bias current through canceling a fraction of the first current which is related to the feedback signal by the second current.

There has also been provided, in accordance with an embodiment of the present disclosure, a power converter having an input port configured to receive an input voltage and an output port configured to provide an output voltage. The power converter may comprise a switch module configured to switch on and off in response to a control signal to convert the input voltage to the output voltage, wherein a switching current flows through the switch module during the on and off switching of the switch module; and a control module configured to respectively receive a feedback signal indicative of the output voltage, a first reference signal indicative of a desired value of the output voltage and a sensing signal indicative of the switching current, and configured to generate an amplified difference signal indicative of a difference between the feedback signal and the first reference signal, and further configured to compare the amplified difference signal with the sensing signal so as to generate the control signal at least partially based on the comparison of the amplified difference signal with the sensing signal.

The control module may comprise a trans-conductance operational amplifier having a first amplifier input terminal, a second amplifier input terminal, a bias current input terminal and an amplifier output terminal, wherein the first amplifier input terminal is configured to receive the feedback signal, the second amplifier input terminal is configured to receive the first reference signal, the bias current input terminal is configured to receive a bias current and the amplifier output terminal is configured to provide the amplified difference signal; and wherein the trans-conductance operational amplifier has a trans-conductance determined by a ratio of the bias current to a substantially constant thermal voltage; and a trans-conductance regulation circuit having a first input terminal configured to receive the output voltage of the power converter and an output terminal configured to provide the bias current to the trans-conductance operational amplifier, wherein the trans-conductance regulation circuit is configured to convert the output voltage to the bias current with a predetermined conversion factor.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components or structures with substantially the same functions for the sake of simplicity.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
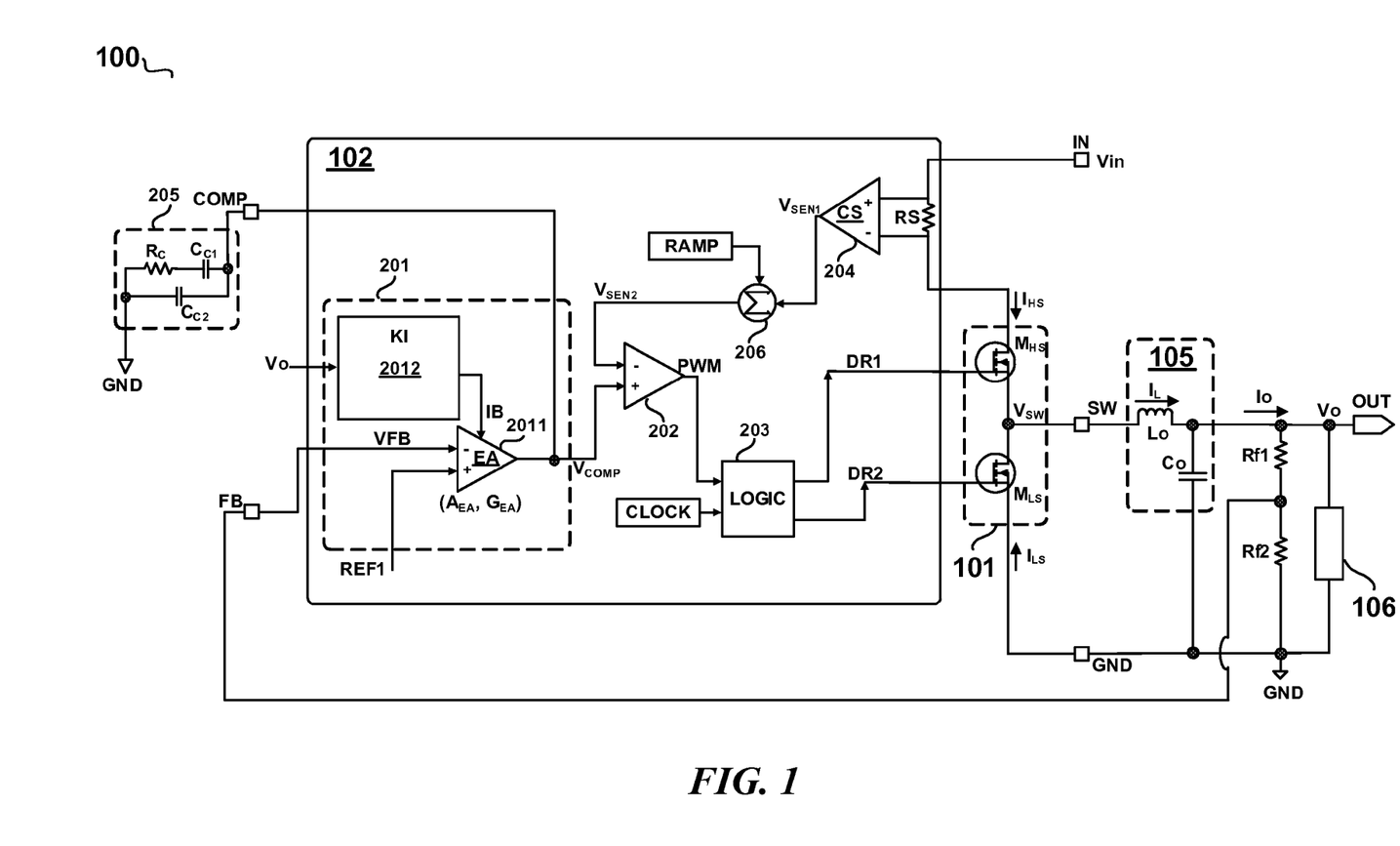
FIG. 1 illustrates a schematic diagram of a power converter 100 in accordance with an exemplary embodiment of the present invention.

FIG. 1 illustrates a schematic diagram of a power converter 100 in accordance with an exemplary embodiment of the present invention. The power converter 100 may comprise an input port IN configured to receive an input voltage Vin; an output port OUT configured to provide an output voltage Vo and an output current Io for supplying a load 105. The power converter 100 further comprises a switch module 101 having a first terminal coupled to the input port IN, a second terminal coupled to the output port OUT, and a control terminal configured to receive a control signal, the switch module 101 is configured to switch on and off based on the control signal to convert the input voltage Vin into the output voltage Vo. In the example of FIG. 1, the control terminal is illustrated as to comprise a first control terminal configured to receive a first control signal DR1 and a second control terminal configured to receive a second control signal DR2, the switch module 101 conduct on and off switching based on the first control signal DR1 and the second control signal DR2. The power converter 100 further comprises a control module 102 configured to detect/receive a feedback signal VFB indicative of the output voltage Vo, and to receive a first reference signal REF1 indicative of a desired value of the output voltage Vo. The control module 102 is configured to provide the control signal (e.g. including the first control signal DR1 and the second control signal DR2 illustrated in FIG. 1) to the switch module 101 at least partially based on the feedback signal VFB and the first reference signal REF1. The control signal regulates the output voltage Vo through appropriately regulating the on and off switching of the switch module 101. For instance, if the load 105 changes, e.g. requiring the output current Io provided to the load 105 to increase or decrease, the output voltage Vo will change instantaneously. The control module 102 then detects the change in the output voltage Vo (e.g. through the feedback signal VFB), and regulates the switch module 101 based on the change in the output voltage Vo from the desired value (e.g. reflected by the difference between the feedback signal VFB and the first reference signal REF1) so as to regulate the output voltage Vo back to the desired value.

In accordance with an exemplary embodiment of the present invention, referring to FIG. 1, the switch module 101 may comprise a high side switch $M_{HS}$ and a low side switch $M_{LS}$ coupled in series between the input terminal IN and a reference ground GND, wherein the high side switch $M_{HS}$ and the low side switch $M_{LS}$ has a common connection SW referred to in the following as a switching output terminal SW, providing a switching voltage $V_{SW}$. The switching output terminal SW may be coupled to the output port OUT via an output filter 103. The output filter 103 is configured to filter the switching voltage $V_{SW}$ into the smoothed output voltage Vo. In the exemplary embodiment illustrated in FIG. 1, the power converter 100 is configured to have a buck (step-down) type topology and may be referred to as a buck (step down) switching power converter. The high side switch $M_{HS}$ and the low side switch $M_{LS}$ are illustrated as to comprise MOSFETs. The output filter 103 is illustrated as to comprise an inductive energy storage component Lo coupled between the switching output terminal SW and the output port OUT, and a capacitive energy storage component Co coupled between the output port OUT and the reference ground GND. The main switch $M_{HS}$ may function as a main switch, and the on and off switching of the main switch $M_{HS}$ can be defined as the on and off switching of the switch module 101. The low side switch $M_{LS}$ is controlled to conduct complementary on and off switching with the main switch $M_{HS}$, i.e. when the main switch $M_{HS}$ is switched on, the low side switch $M_{LS}$ is switched off and vice versa. During the on and off switching of the switch module 101, a switching current is generated, e.g. during the on and off switching of the high side switch $M_{HS}$, a high side switching current $I_{HS}$ flows through the high side switch $M_{HS}$, and during the on and off switching of the low side switch $M_{LS}$, a low side switching current $I_{LS}$ flows through the low side switch $M_{LS}$. Meanwhile, an inductor current $I_L$ flows through the inductive energy storage component Lo. The ordinary artisan should understand that the embodiment of FIG. 1 is not intended to be limiting. For example, in other embodiments, the high side switch $M_{HS}$ may comprise other controllable switching device such as JFET, BJT, IGBT etc. Similarly, the low side switch $M_{LS}$ may also comprise other switching device, including controllable MOSFET, JFET, IGBT, freewheeling diode etc. In still other embodiments, the power converter 100 may have other converter topologies and may be configured as other types of switching converters, such as boost type, buck-boost type, flyback type etc.

In accordance with an embodiment of the present invention, the control module 102 of the power converter 100 may have a first control input terminal configured to receive the feedback signal VFB and a second control input terminal configured to receive the first reference signal REF1. The control module 102 is configured to conduct operation to the feedback signal VFB and the first reference signal REF1 to provide an amplified difference signal $V_{COMP}$ indicative of the difference between the feedback signal VFB and the first reference signal REF1. The control module 102 is further configured to compare the amplified difference signal $V_{COMP}$ with a sensing signal $V_{SEN2}$ to generate a pulse width modulation signal PWM, wherein the sensing signal $V_{SEN2}$ is indicative of the switching current ($I_{HS}$ or $I_{LS}$) or the inductor current $I_L$. The control module 102 is further configured to generate the first control signal DR1 and the second control signal DR2 based on the pulse width modulation signal PWM and a system clock signal CLK. With this configuration, a negative feedback loop is established in the control module 102 to regulate the output voltage Vo.

In accordance with an exemplary embodiment of the present invention, the power converter 100 may further comprise a feedback circuit coupled to the output port OUT and configured to detect the output voltage Vo so as to provide the feedback signal VFB with a feedback coefficient $K_{FB}$ applied. Thus, the feedback signal VFB may be expressed as VFB=$K_{FB}$*Vo. In FIG. 1, the feedback circuit is illustrated to comprise a first feedback resistor Rf1 and a second feedback resistor Rf2 connected in series between the output port OUT and the reference ground GND. The feedback signal VFB is provided from the common connection of the first feedback resistor Rf1 and the second feedback resistor Rf2. In this particular example, the feedback coefficient $K_{FB}$ may be expressed as $K_{FB}$=Rf2/(Rf1+Rf2). In other embodiments, the feedback circuit may comprise other circuit elements. In certain embodiment, the power converter 100 may not comprise the feedback module and the output voltage Vo may be provided as the feedback signal VFB.

In accordance with an exemplary embodiment of the present invention, still referring to FIG. 1, the control module 102 of the power converter 100 may comprise an error amplifier module 201, a pulse width modulation module 202 and a logic control module 203.

The error amplifier module 201 is configured to respectively receive the feedback signal VFB and the first reference signal REF1, and to provide the amplified difference signal $V_{COMP}$ based on processing the feedback signal VFB and the first reference signal REF1. To provide an example, the error amplifier module 201 may comprise an operational amplifier 2011. The operational amplifier 2011 may have a first amplifier input terminal (e,g, the "−" input terminal of 2011 in FIG. 1), a second amplifier input terminal (e,g, the "+" input terminal of 2011 in FIG. 1) and an amplifier output terminal. The first amplifier input terminal is configured to receive the feedback signal VFB, the second amplifier input terminal is configured to receive the first reference signal REF1 and the operational amplifier 2011 is configured to calculate a difference between the feedback signal VFB and the first reference signal REF1 and amplify the difference to provide the amplified difference signal $V_{COMP}$ at the amplifier output terminal. In accordance with an embodiment of the present invention, the operational amplifier 2011 is of trans-conductance type having a trans-conductance $G_{EA}$ and a middle frequency gain $A_{EA}$. The trans-conductance operational amplifier 2011 may further have a bias input terminal configured to receive a bias current IB. The trans-conductance $G_{EA}$ may be determined by a ratio of the bias current IB to a thermal voltage VT, i.e. $G_{EA}$=IB/VT, wherein the thermal voltage VT depends on the absolute temperature T as VT=k*T/q, where q is the magnitude of the electrical charge on an electron with a value 1.6×10^-19 C and k is the Boltzmann's constant with a value 1.38×10^-23 J/K. Therefore, should the absolute temperature T vary quite small, the thermal voltage VT is substantially constant and the trans-conductance $G_{EA}$ is mainly determined by the bias current IB. For the control module 102 using a trans-conductance operational amplifier, a compensation module 205 is generally provided and coupled to the output terminal of the trans-conductance operational amplifier 2011 to provide stability compensation to the negative feedback loop. In FIG. 1, the compensation module 205 is exemplarily illustrated as to comprise a first compensation capacitor $C_{C1}$, a second compensation capacitor $C_{C2}$ and a compensation resistor $R_C$, wherein the first compensation capacitor $C_{C1}$ and the compensation resistor $R_C$ are connected in series between the output terminal of the operational amplifier 2011 and the reference ground GND and wherein the second compensation capacitor $C_{C2}$ is coupled between the output terminal of the operational amplifier 2011 and the reference ground GND. In this example, the middle frequency gain $A_{EA}$ of the trans-conductance operational amplifier 2011 may be expressed by $A_{EA}=G_{EA}*R_C$. The compensation module 205 may be integrated inside the power converter 100 or be provided from outside by customers. In FIG. 1, it is illustrated that the compensation module is customer provided to a compensation pin COMP of the power converter 100, wherein the compensation pin COMP is connected to the output terminal of the operational amplifier 2011.

The error amplifier module 201 may further comprise a trans-conductance regulation circuit 2012 which is configured to provide the bias current IB to regulate the trans-conductance $G_{EA}$ of the operational amplifier 2011. In accordance with an embodiment of the present invention, the trans-conductance regulation circuit 2012 may at least have a first input terminal configured to receive the output voltage Vo, and may be configured to generate the bias current IB at least partially based on the output voltage Vo, wherein the output voltage Vo may be converted to the bias current IB with a predetermined conversion factor KI, i.e. IB=KI*Vo. In accordance with an embodiment of the present invention, the trans-conductance regulation circuit 2012 may comprise a voltage to current conversion circuit having the conversion factor KI.

The pulse width modulation module 202 may be configured to receive the amplified difference signal $V_{COMP}$ and the sensing signal $V_{SEN2}$, and to compare the amplified difference signal $V_{COMP}$ with the sensing signal $V_{SEN2}$ to generate the pulse width modulation signal PWM. In an exemplary embodiment, the pulse width modulation module 202 may comprise a comparator having a first comparison input terminal (e.g. the "−" input terminal of 202 in FIG. 1), a second comparison input terminal (e.g. the "+" input terminal of 202 in FIG. 1) and a comparison output terminal, wherein the first comparison input terminal is configured to receive the sensing signal $V_{SEN2}$, the second comparison input terminal is configured to receive the amplified difference signal $V_{COMP}$, and the comparison output terminal is configured to provide the pulse width modulation signal PWM.

The logic control module 203 may be configured to respectively receive the system clock signal CLK and the pulse width modulation signal PWM so as to generate the control signal (e,g, including the first control signal DR1 and the second control signal DR2) to the switch module 101. The control signal is configured to turn the high side switch $M_{HS}$ off (e.g. through the first control signal DR1) in response to the pulse width modulation signal PWM and to turn the high side switch $M_{HS}$ on in response to the system clock signal CLK. Meanwhile, the control signal is further configured to turn the low side switch $M_{LS}$ on (e.g. through the second control signal DR2) in response to the pulse width modulation signal PWM and to turn the low side switch $M_{LS}$ off in response to the system clock signal CLK. In accordance with an exemplary embodiment, the logic control module 203 may comprise logic operation circuits, e.g. flip-flop etc. In accordance with an embodiment, the first control signal DR1 is configured to turn the high side switch $M_{HS}$ off in response to the pulse width modulation signal PWM when the sensing signal $V_{SEN2}$ is higher than the amplified difference signal $V_{COMP}$. That is to say, when the sensing signal $V_{SEN2}$ is higher than the amplified difference signal $V_{COMP}$, the pulse width modulation signal PWM triggers the first control signal DR1 to turn the high side switch $M_{HS}$ off. In contrast, when the sensing signal $V_{SEN2}$ is higher than the amplified difference signal $V_{COMP}$, the pulse width modulation signal PWM does not trigger the first control signal DR1.

In accordance with an embodiment of the present invention, the sensing signal $V_{SEN2}$ may be provided by sensing the high side switching current $I_{HS}$ or the low side switching current $I_{LS}$ or the inductor current $I_L$. The inductor current $I_L$ is actually same as the high side switching current $I_{HS}$ when the high side switch $M_{HS}$ is turned on and same as the low side switching current $I_{LS}$ when the high side switch $M_{HS}$ is turned off. Since the control module 102 is configured to control the cutting off of energy transmission from the input port IN to the output port OUT (e.g. turning off the high side switch $M_{HS}$) through comparing the sensing signal $V_{SEN2}$ with the amplified difference signal $V_{COMP}$, it can be understand that the amplified difference signal $V_{COMP}$ actually limits the value of the sensing signal $V_{SEN2}$, equivalent to limiting the value of the inductor current $I_L$. Therefore, the inductor current $I_L$ may be considered as a voltage controlled current source controlled by the amplified difference signal $V_{COMP}$, having a controlling trans-conductance $G_{CS}$. The controlling trans-conductance $G_{CS}$ may be substantially constant and designed according to practical application requirements of the switching power converter 100.

Figure 2:
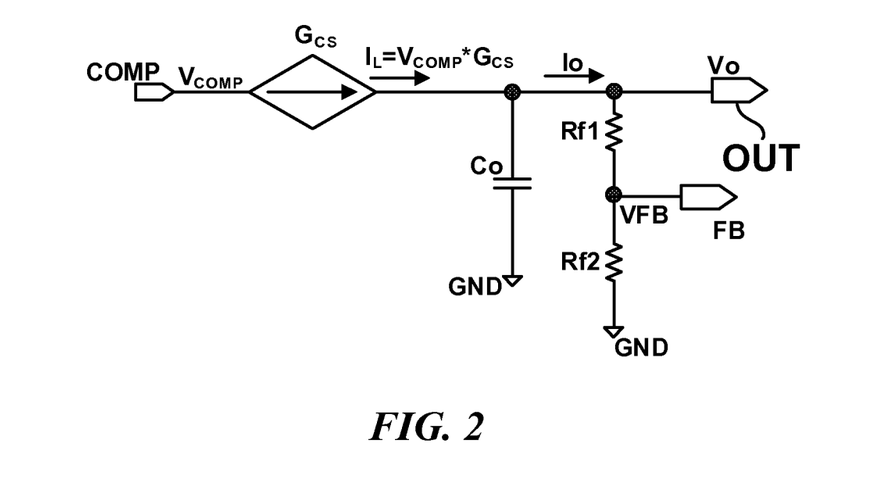
FIG. 2 illustrates a voltage control model from the output terminal of the error amplifier module 201 to the output port OUT of the switching power converter 100 in accordance with an exemplary embodiment of the present invention.

FIG. 2 illustrates a voltage control model from the output terminal (e.g. the compensation pin COMP) of the error amplifier module 201 to the output port OUT of the switching power converter 100. The inductor current $I_L$ may be expressed as $I_L \approx V_{COMP}*G_{CS}$. From the control model illustrated in FIG. 2, it can be deduced that a band width GBW of the negative feedback loop can be expressed by the following expression (1).

$$GBW = A_{EA} * \frac{G_{CS}}{2\pi * Co} * K_{FB} = \frac{IB}{VT} * R_C * \frac{G_{CS}}{2\pi * Co} * K_{FB} \qquad (1)$$

According to the embodiments of the present invention described above, the bias current IB provided by the trans-conductance regulation circuit 2012 is IB=KI*Vo, the feedback coefficient $K_{FB}$=VFB/Vo, put them in the expression above, the following expression (2) is obtained.

$$GBW = \frac{KI}{VT} * R_C * \frac{G_{CS}}{2\pi * Co} * V_{FB} \qquad (2)$$

From the expression (2), it can be understand that the error amplifier module 201 in accordance with various embodiments of the present invention may help to maintain the band width GBW of the negative feedback loop established for regulating the power converter 100 substantially constant. This is because in the above expression (2), the predetermined conversion factor KI, the thermal voltage VT, and the controlling trans-conductance $G_{CS}$ are substantially constant. Under a provided application occasion, the compensation resistor $R_C$ and the output capacitance Co are given and substantially unchanging, and the feedback signal $V_{FB}$ substantially tracks and equalizes to the first reference signal REF1, which has a substantially constant value, under the regulation of the negative feedback loop. Therefore, the band width GBW determined by the expression (2) does not change with the output voltage Vo, i.e. the band width GBW will not be influenced by variations in the output voltage Vo.

For instance, providing that the first reference signal REF1 has a constant value of 0.925V, should the desired value of the output voltage Vo is changed from 3V to 5V, the feedback coefficient should be changed accordingly from $K_{FB(Vo=3V)}=0.925/3$ to $K_{FB(VO=5V)}=0.925/5$. In accordance with various embodiments of the present invention, through configuring the trans-conductance $G_{EA}$ of the operational amplifier 2011 to be direct proportional to the output voltage Vo, the Vo as numerator in the trans-conductance $G_{EA}$ is counteracted with the Vo as denominator in the feedback coefficient $K_{FB}$ in the expression (1) of the band width GBW. Therefore, the final result of the expression (1) does not contain the output voltage Vo.

Turning back to FIG. 1, in accordance with an embodiment of the present invention, the control module 102 of the power converter 100 may further comprise a current sensing module 204. The current sensing module 204 is configured to sense the high side switching current $I_{HS}$ to provide a high side sensing signal $V_{SEN1}$. In an exemplary embodiment, the current sensing module 204 may comprise a sensing resistor, a sensing amplifier and/or other known current sensing components. In FIG. 1, the current sensing module 204 is illustrated as to comprise a current sensing resistor RS and a current sensing amplifier CS. The current sensing resistor RS is coupled in series with the high side switch $M_{HS}$. The current sensing amplifier CS may have a first sensing input terminal (e.g. the "+" input terminal of amplifier CS in FIG. 1), a second sensing input terminal (e.g. the "−" input terminal of amplifier CS in FIG. 1) and a sensing output terminal, wherein the first sensing input terminal is coupled to a first terminal (e.g. the terminal coupled to the input port IN) of the sensing resistor RS and the second sensing input terminal is coupled to a second terminal (e.g. the terminal coupled to the high side switch $M_{HS}$) of the sensing resistor RS. The current sensing amplifier CS is configured to provide the high side sensing signal $V_{SEN1}$ at the sensing output terminal based on sensing the high side switching current $I_{HS}$ by the sensing resistor RS. For eliminating or at least reducing subharmonic oscillation, the control module 102 may further comprise a ramp compensation module 206 configured to respectively receiving the high side sensing signal $V_{SEN1}$ and a ramp compensation signal RAMP, and to superpose the ramp compensation signal RAMP to the high side sensing signal $V_{SEN1}$ to generate the sensing signal $V_{SEN2}$.

Figure 3:
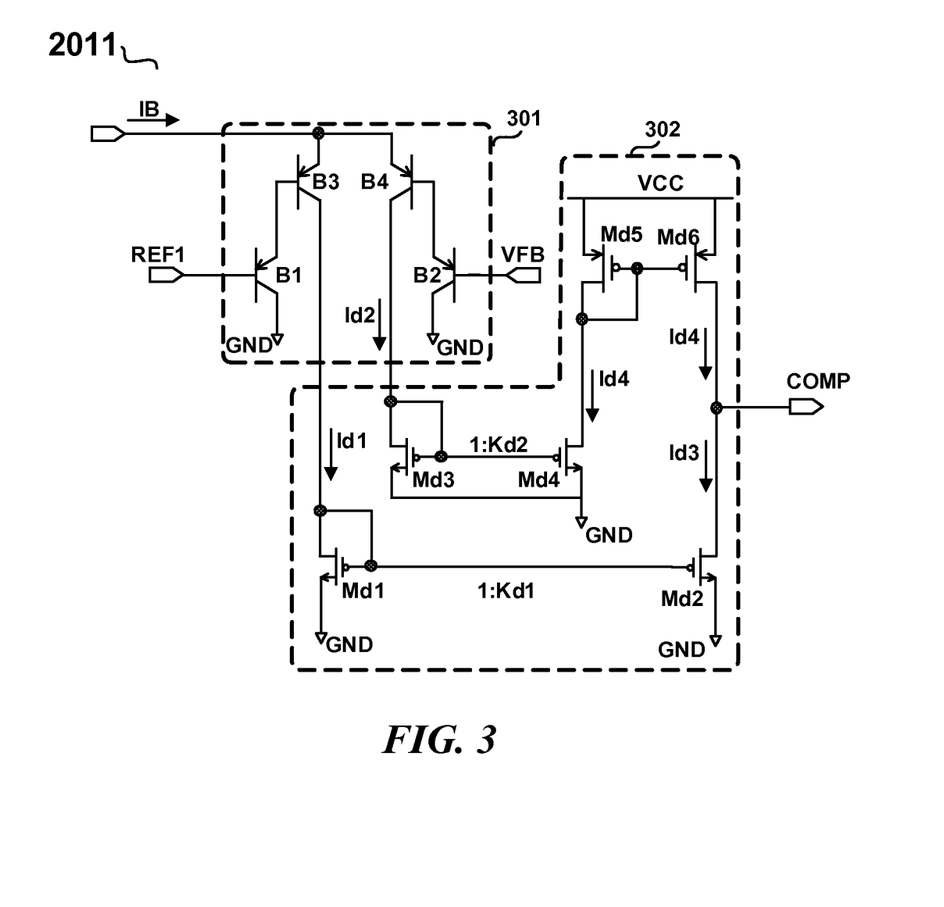
FIG. 3 illustrates a schematic diagram of a trans-conductance operational amplifier 2011 in accordance with an embodiment of the present invention.

FIG. 3 illustrates a schematic diagram of a trans-conductance operational amplifier 2011 in accordance with an embodiment of the present invention. In this exemplary embodiment, the trans-conductance operational amplifier 2011 may comprise a differential input stage 301 and a trans-conductance output stage 302. The differential input stage 301 may have a bias current input terminal configured to receive the bias current IB. The differential input stage 301 may comprise a first differential branch and a second differential branch, wherein the first differential branch and the second differential branch are configured to have symmetrical circuit structure, and wherein the first differential branch is configured to generate a first differential current Id1 based on the bias current IB and the first reference signal REF1, and wherein the second differential branch is configured to generate a second differential current Id2 based on the bias current IB and the feedback signal VFB. In one embodiment, the first differential branch has a first power input terminal, a first differential input terminal and a first differential output terminal, the second differential branch has a second power input terminal, a second differential input terminal and a second differential output terminal. The first power input terminal and the second power input terminal are coupled together to receive the bias current IB. The first differential input terminal and the second differential input terminal are respectively configured to receive the first reference signal REF1 and the feedback signal VFB. The first differential output terminal and the second differential output terminal are respectively configured to provide the first differential current Id1 and the second differential current Id2. In FIG. 3, the differential input stage 301 is illustrated to comprise a first bipolar junction transistor ("BJT") B1, a second BJT B2, a third BJT B3 and fourth BJT B4, all having a base, a emitter and a collector. The first BJT B1 and the third BJT B3 are configured to form the first differential branch. The base of the first BJT B1 is configured to receive the first reference signal REF1, the collector of the first BJT B1 is coupled to the reference ground GND, and the emitter of the first BJT B1 is coupled to the base of the third BJT B3. The emitter of the third BJT B3 is coupled to the emitter of the fourth BJT B4 and is configured to receive the bias current IB, and the collector of the third BJT B3 is configured to provide the first differential current Id1. The second BJT B2 and the fourth BJT B4 are configured to form the second differential branch. The base of the second BJT B2 is configured to receive the feedback signal VFB, the collector of the second BJT B2 is coupled to the reference ground GND, and the emitter of the second BJT B2 is coupled to the base of the fourth BJT B4. The emitter of the fourth BJT B4 is coupled to the emitter of the third BJT B3 and is configured to receive the bias current IB, and the collector of the fourth BJT B4 is configured to provide the second differential current Id2.

The trans-conductance output stage 302 of the trans-conductance operational amplifier 2011 may comprise a first current mirror, a second current mirror and an output current mirror, each having a mirror input terminal and a mirror output terminal. The first current mirror is configured to receive the first differential current Id1 at its mirror input terminal, and is further configured to mirror the first differential current Id1 with a first predetermined mirror factor Kd1 to provide a first mirrored current Id3 at its mirror output terminal, i.e. Id3=Kd1*Id1. The second current mirror is configured to receive the second differential current Id2 at its mirror input terminal, and is further configured to mirror the second differential current Id2 with a second predetermined mirror factor Kd2 to provide a second mirrored current Id4 at its mirror output terminal, i.e. Id4=Kd2*Id2. The first predetermined mirror factor and the second predetermined mirror factor are equal. The mirror input terminal of the output current mirror is coupled to the mirror output terminal of the second current mirror to receive the second mirrored current Id4, and the mirror output terminal of the output current mirror is coupled to the mirror output terminal of the first current mirror to form the output terminal of the operational amplifier 2011. The output current mirror is designed to have a mirror factor of 1, thus a differential current Id which is a difference between the first mirrored current Id3 and the second mirrored current Id4 is generated at the output terminal of the operational amplifier 2011. The differential current Id then flows through the compensation module 205 to generate the amplified difference signal $V_{COMP}$. In FIG. 3, the first current mirror is illustrated as to comprise a first metal oxide semiconductor field effect transistor ("MOSFET") Md1 and a second MOSFET Md2. The second current mirror is illustrated to comprise a third MOSFET Md3 and a fourth MOSFET Md4. The output current mirror is illustrated to comprise a fifth MOSFET Md5 and a sixth MOSFET Md6. The connection and configuration of the MOSFETs Md1-Md6 are illustrated in FIG. 3 and will not be addressed in detail herein. One of ordinary skilled in the art should understand that the circuit elements and connection relationships of the differential input stage 301 and the trans-conductance output stage 302 illustrated in FIG. 3 are exemplary and not intended to be limiting. For instance, in other embodiments, it may not be confined to employ BJTs and MOSFETs.

Figure 4:
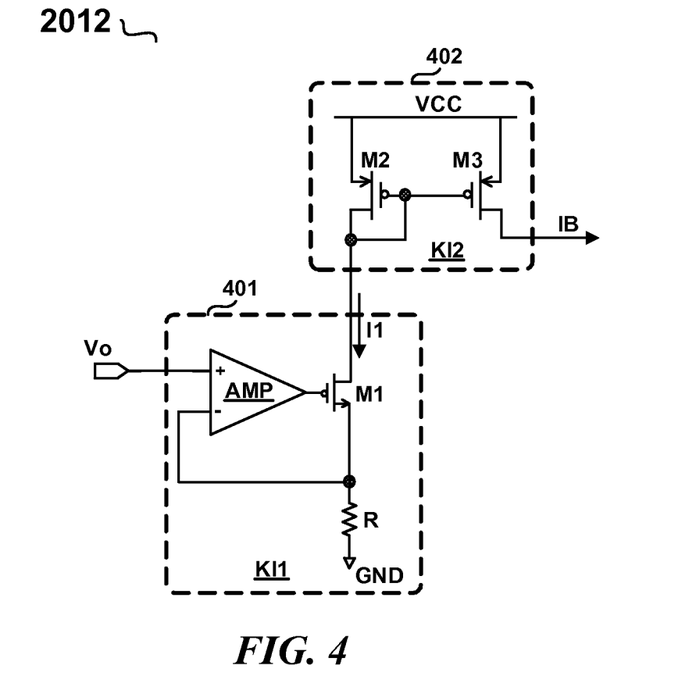
FIG. 4 illustrates a schematic diagram of a trans-conductance regulation circuit 2012 in accordance with an embodiment of the present invention.

FIG. 4 illustrates a schematic diagram of a trans-conductance regulation circuit 2012 in accordance with an embodiment of the present invention. The trans-conductance regulation circuit 2012 (or the voltage to current conversion circuit of the trans-conductance regulation circuit 2012) may comprise: a conversion module 401 and a current output module 402. The conversion module 401 is configured to receive the output voltage Vo and to convert the output voltage Vo into a first current I1 with a first predetermined conversion factor KI1, i.e. I1=KI1*Vo, wherein the first current I1 is configured to flow from outside to inside of the conversion module 401. The current output module 402 is configured to receive the first current I1 and to convert the first current I1 into the bias current IB with a second predetermined conversion factor KI2, i.e. I2=KI2*I1, wherein the second current I2 is configured to flow from inside to outside of the current output module 402. In this exemplary embodiment, the predetermined conversion factor KI of the trans-conductance regulation circuit 2012 is determined by the first predetermined conversion factor KI1 and the second predetermined conversion factor KI2 and may be expressed as KI=KI1*KI2.

In FIG. 4, the conversion module 401 is illustrated exemplarily as to comprise an operational amplifier AMP, a first transistor M1 and a coefficient resistor R. The operational amplifier AMP may have a non-inverted input terminal ("+" input terminal), an inverted input terminal ("−" input terminal) and an output terminal. The first transistor M1 may have a gate, a source and a drain. The coefficient resistor R may have a first terminal and a second terminal. The non-inverted input terminal of the operational amplifier AMP is configured to receive the output voltage Vo, the inverted input terminal of the operational amplifier AMP and the source of the first transistor M1 are coupled to the first terminal of the coefficient resistor R. The second terminal of the coefficient resistor R is connected to the reference ground GND. The gate of the first transistor M1 is coupled to the output terminal of the operational amplifier AMP, and the drain of the first transistor M1 is configured to provide the first current I1. In this exemplary embodiment, the first current I1 may actually be expressed by I1=Vo/R, i.e. KI1=1/R. Therefore, the first predetermined conversion factor KI1 may be set by modifying a resistance of the coefficient resistor R. The current output module 402 is exemplarily illustrated to comprise a second transistor M2 and a third transistor M3, each having a gate, a source and a drain, wherein the second transistor M2 and the third transistor M3 are configured to form a current mirror. The source of the second transistor M2 and the source of the third transistor M3 are coupled to an internal supply voltage VCC. The drain and the gate of the second transistor M2 are coupled together to receive the first current I1. The gate of the third transistor M3 is coupled to the gate of the second transistor M2, and the drain of the third transistor M3 is configured to provide the bias current IB. In this exemplary embodiment, the bias current IB may actually be expressed by IB=(W/L)$_3$/(W/L)$_2$*I1, i.e. KI2=(W/L)$_3$/(W/L)$_2$, wherein (W/L)$_2$ is a width to length ratio of a channel of the second transistor M2, and (W/L)$_3$ is a width to length ratio of a channel of the third transistor M3. Therefore, the second predetermined conversion factor KI2 may be set by modifying a ratio of the width to length ratio (W/L)$_3$ of the third transistor M3 to the width to length ratio (W/L)$_2$ of the second transistor M2.

Figure 5:
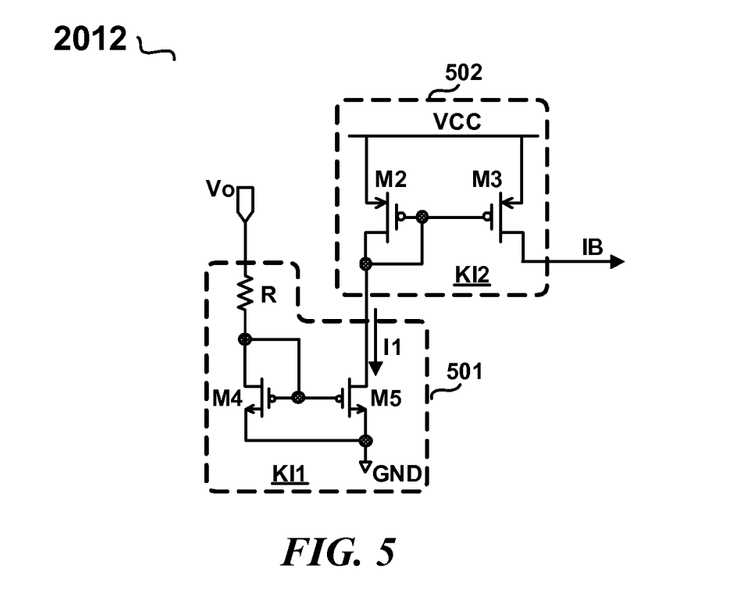
FIG. 5 illustrates a schematic diagram of a trans-conductance regulation circuit 2012 in accordance with an alternative embodiment of the present invention.

FIG. 5 illustrates a schematic diagram of a trans-conductance regulation circuit 2012 in accordance with an alternative embodiment of the present invention. In the example of FIG. 5, the trans-conductance regulation circuit 2012 (or the voltage to current conversion circuit of the trans-conductance regulation circuit 2012) may comprise a conversion module 501 and a current output module 502. The conversion module 501 is configured to receive the output voltage Vo and to convert the output voltage Vo into a first current I1 with a first predetermined conversion factor KI1, i.e. I1=KI1*Vo, wherein the first current I1 is configured to flow from outside to inside of the conversion module 501. The current output module 502 is configured to receive the first current I1 and to convert the first current I1 into the bias current IB with a second predetermined conversion factor KI2, i.e. I2=KI2*I1, wherein the second current I2 is configured to flow from inside to outside of the current output module 502. In this exemplary embodiment, the predetermined conversion factor KI of the trans-conductance regulation circuit 2012 is determined by the first predetermined conversion factor KI1 and the second predetermined conversion factor KI2 and may be expressed as KI=KI1*KI2. In FIG. 5, the conversion module 501 is illustrated exemplarily as to comprise a coefficient resistor R, a fourth transistor M4 and a fifth transistor M5, wherein the coefficient resistor R may have a first terminal and a second terminal, the fourth and the fifth transistors M4 and M5 respectively have a gate, a source and a drain, and are configured to form a current mirror. The first terminal of the coefficient resistor R is configured to receive the output voltage Vo, the second terminal of the coefficient resistor R is coupled to the drain of the fourth transistor M4. The drain and the gate of the fourth transistor M4 are coupled together, and the source of the fourth transistor M4 is coupled to the reference ground GND. The gate of the fifth transistor M5 is coupled to the gate of the fourth transistor M4, the source of the fifth transistor M5 is coupled to the reference ground GND, and the drain of the fifth transistor M5 is configured to provide the first current I1. In this exemplary embodiment, the first current I1 may actually be expressed by I1=Vo/R*(W/L)$_5$/(W/L)$_4$, i.e. KI1=(1/R)*(W/L)$_5$/(W/L)$_4$, wherein (W/L)$_4$ is a width to length ratio of a channel of the fourth transistor M4, and (W/L)$_5$ is a width to length ratio of a channel of the fifth transistor M5. Therefore, the first predetermined conversion factor KI1 may be set by modifying a resistance of the coefficient resistor R and a ratio of the width to length ratio (W/L)$_5$ of the fifth transistor M5 to the width to length ratio (W/L)$_4$ of the fourth transistor M4. The current output module 502 may have the same configuration as the current output module 402 illustrated in FIG. 4 and is thus not addressed again.

Figure 6:
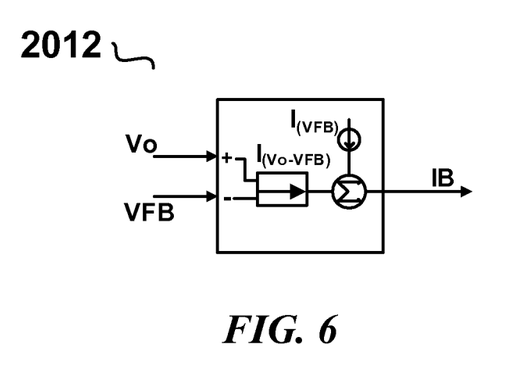
FIG. 6 illustrates a schematic diagram of a trans-conductance regulation circuit 2012 in accordance with an alternative embodiment of the present invention.

FIG. 6 illustrates a schematic diagram of a trans-conductance regulation circuit 2012 in accordance with an alternative embodiment of the present invention. In the example of FIG. 6, the trans-conductance regulation circuit 2012 may further have a second input terminal configured to receive the feedback signal VFB. The trans-conductance regulation circuit 2012 (or the voltage to current conversion circuit of the trans-conductance regulation circuit 2012) may be configured to provide a first current, labeled as $I_{(Vo-VFB)}$ in FIG. 6, based on a difference between the output voltage Vo and the feedback signal VFB. Thus, the first current $I_{(Vo-VFB)}$ is a function of the difference between the output voltage Vo and the feedback signal VFB. The trans-conductance regulation circuit 2012 (or the voltage to current conversion circuit of the trans-conductance regulation circuit 2012) may be further configured to provide a second current, labeled as $I_{(VFB)}$ in FIG. 6, based on the feedback signal VFB. Thus, the second current $I_{(VFB)}$ is a function of the feedback signal VFB. The trans-conductance regulation circuit 2012 (or the voltage to current conversion circuit of the trans-conductance regulation circuit 2012) may be further configured to generate the bias current IB through canceling a fraction of the first current $I_{(Vo-VFB)}$ which is related to the feedback signal VFB by the second current $I_{(VFB)}$.

Figure 7:
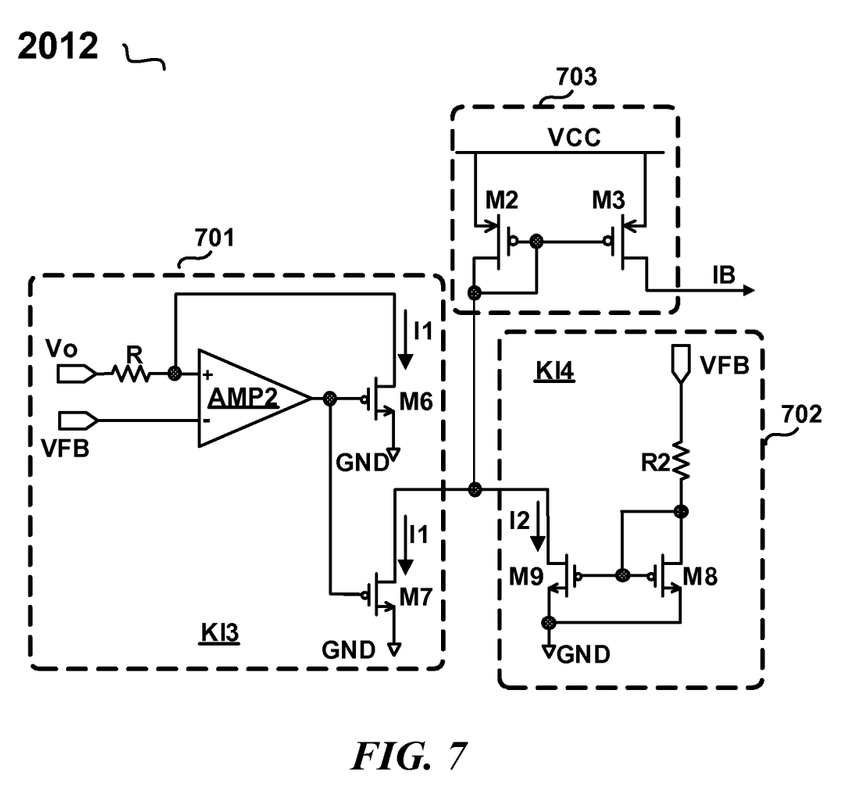
FIG. 7 illustrates a schematic diagram of a trans-conductance regulation circuit 2012 in accordance with an alternative embodiment of the present invention.

FIG. 7 illustrates a schematic diagram of a trans-conductance regulation circuit 2012 in accordance with an alternative embodiment of the present invention. The example of FIG. 7 may be considered as a more detailed structure of the embodiment shown in FIG. 6. The trans-conductance regulation circuit 2012 (or the voltage to current conversion circuit of the trans-conductance regulation circuit 2012) is illustrated to comprise: a first conversion module 701, a second conversion module 702 and a current output module 703. The first conversion module 701 may have a first conversion input terminal, a second conversion input terminal and a conversion output terminal, wherein the first conversion input terminal is configured to receive the output voltage Vo, and the second conversion input terminal is configured to receive the feedback signal VFB. The first conversion module 701 is configured to convert a difference between the output voltage Vo and the feedback signal VFB to a first current I1 with a third predetermined conversion factor KI3, i.e. I1=KI3*(Vo−VFB). The second conversion module 702 may have a conversion input terminal configured to receive the feedback signal VFB, and a conversion output terminal configured to provide a second current I2. The second conversion module 702 is configured to convert the feedback signal VFB into the second current I2 with a fourth predetermined conversion factor KI4, i.e. I2=KI4*VFB. The current output module 703 is configured to respectively receive the first current I1 from the first conversion module 701 and the second current I2 from the second conversion module 702, and to superpose the first current I1 with the second current I2 to generate the bias current IB, i.e. IB=I1+I2=KI3*(Vo−VFB)+KI4*VFB. By setting the third predetermined conversion factor KI3 to be equal to the fourth predetermined conversion factor KI4, the fraction related with the feedback VFB in the expression of the bias current IB above may be cancelled and it can be deduced that IB=KI3*Vo=KI4*Vo.

In FIG. 7, the first conversion module 701 is illustrated exemplarily as to comprise: an operational amplifier AMP2, a sixth transistor M6, a seventh transistor M7 and a coefficient resistor R. The operational amplifier AMP2 may have a non-inverted input terminal ("+" input terminal), an inverted input terminal ("−" input terminal) and an output terminal. The sixth transistor M6 and the seventh transistor M7 may respectively have a gate, a source and a drain. The coefficient resistor R may have a first terminal and a second terminal. The first terminal of the coefficient resistor R is configured to receive the output voltage Vo, the second terminal of the coefficient resistor R is coupled to the non-inverted input terminal of the operational amplifier AMP2. The inverted input terminal of the operational amplifier AMP2 is configured to receive the feedback signal VFB. The gate of the sixth transistor M6 is coupled to the output terminal of the operational amplifier AMP2, the drain of the sixth transistor M6 is coupled to the non-inverted input terminal of the operational amplifier AMP2, and the source of the sixth transistor M6 is coupled to the reference ground GND. The gate of the seventh transistor M7 is coupled to the gate of the sixth transistor M6, the source of the seventh transistor M7 is coupled to the reference ground GND and the drain of the seventh transistor M7 is configured to provide the first current I1. In this configuration, the first current I1 may actually be expressed as I1=(Vo−VFB)/R, i.e. KI3=1/R. Therefore, the third predetermined conversion factor KI3 may be set by modifying a resistance of the coefficient resistor R.

The second conversion module 702 is illustrated exemplarily as to comprise: a second coefficient resistor R2, an eighth transistor M8 and a ninth transistor M9, wherein the second coefficient resistor R2 may have a first terminal and a second terminal, the eighth transistor M8 and the ninth transistor M9 respectively have a gate, a source and a drain and are configured to form a current mirror. The first terminal of the second coefficient resistor R2 is configured to receive the feedback signal VFB, the second terminal of the second coefficient resistor R2 is coupled to the drain of the eighth transistor M8. The drain and the gate of the eighth transistor M8 are coupled together, and the source of the eighth transistor M8 is coupled to the reference ground GND. The gate of the ninth transistor M9 is coupled to the gate of the eighth transistor M8, the source of the ninth transistor M9 is coupled to the reference ground GND, and the drain of the ninth transistor M9 is configured to provide the second current I2. In this example, the second current I2 may actually be expressed by I2=$(W/L)_9/(W/L)_8$*(VFB/R2), i.e. KI4=$(W/L)_9/(W/L)_8$*(1/R2), wherein $(W/L)_8$ is a width to length ratio of a channel of the eighth transistor M8, and $(W/L)_9$ is a width to length ratio of a channel of the ninth transistor M9. Therefore, the fourth predetermined conversion factor KI4 may be set by modifying a resistance of the second coefficient resistor R2, and/or a ratio of the width to length ratio $(W/L)_9$ of the ninth transistor M9 to the width to length ratio $(W/L)_8$ of the eighth transistor M8. In accordance with an embodiment of the present invention, the resistance of the second coefficient resistor R2 may be designed as to be equal to the resistance of the coefficient resistor R, and the ratio of the width to length ratio $(W/L)_9$ of the ninth transistor M9 to the width to length ratio $(W/L)_8$ of the eighth transistor M8 may be set to be 1 so that the fourth predetermined conversion factor KI4 is equal to the third predetermined conversion factor KI3. One of ordinary skilled in the art should understand that this is just to provide examples for better understanding and is not intended to be limiting. In other embodiments, the coefficient resistor R and the second coefficient resistor R2 may not have the same resistance, the ratio of the width to length ratio $(W/L)_9$ of the ninth transistor M9 to the width to length ratio $(W/L)_8$ of the eighth transistor M8 may be not be 1, but can have other suitable values making the fourth predetermined conversion factor KI4 equal to the third predetermined conversion factor KI3.

The current output module 702 in FIG. 7 may have the same configuration as the current output module 402 of the embodiment illustrated in FIG. 4 and thus will not be addressed again. One difference is that the drain of the second transistor M2 may be configured to receive both the first current I1 and the second current I2 so as to superpose them.

The advantages of the various embodiments of the trans-conductance regulation circuit 2012, the trans-conductance error amplifier module 201 and the power converter (e.g. the power converter 100) comprising the same of the present invention are not confined to those described above. These and other advantages of the various embodiments of the present invention will become more apparent upon reading the whole detailed descriptions and studying the various figures of the drawings.

From the foregoing, it will be appreciated that specific embodiments of the present invention have been described herein for purposes of illustration, but that various modifications may be made without deviating from the spirit and scope of various embodiments of the present invention. Many of the elements of one embodiment may be combined with other embodiments in addition to or in lieu of the elements of the other embodiments. Accordingly, the present invention is not limited except as by the appended claims.

I claim:

1. A trans-conductance regulation circuit for regulating a trans-conductance of a trans-conductance operational amplifier in a power converter, wherein the power converter is configured to convert an input voltage into an output voltage, and wherein the trans-conductance operational amplifier has a bias current input terminal configured to receive a bias current, and wherein the trans-conductance is determined by a ratio of the bias current to a substantially constant thermal voltage; the trans-conductance regulation circuit comprising:
 a first input terminal configured to receive the output voltage of the power converter; and
 a voltage to current conversion circuit configured to convert the output voltage to the bias current with a predetermined conversion factor.

2. The trans-conductance regulation circuit of claim 1, wherein the voltage to current conversion circuit comprises:
 a conversion module configured to receive the output voltage and to convert the output voltage into a first current with a first predetermined conversion factor, wherein the first current is configured to flow from outside to inside of the conversion module; and
 a current output module configured to receive the first current and to convert the first current into the bias current with a second predetermined conversion factor, wherein the bias current is configured to flow from inside to outside of the current output module.

3. The trans-conductance regulation circuit of claim 2, wherein the conversion module comprises:
 an operational amplifier, a first transistor and a coefficient resistor, wherein the operational amplifier has a non-inverted input terminal, an inverted input terminal and an output terminal, and wherein the first transistor has a gate, a source and a drain, and wherein the coefficient resistor has a first terminal and a second terminal; and wherein
 the non-inverted input terminal of the operational amplifier is configured to receive the output voltage, and the inverted input terminal of the operational amplifier is coupled to the first terminal of the coefficient resistor; and wherein
 the second terminal of the coefficient resistor is connected to a reference ground; and wherein
 the gate of the first transistor is coupled to the output terminal of the operational amplifier, the source of the first transistor is coupled to the first terminal of the coefficient resistor, and the drain of the first transistor is configured to provide the first current; and wherein
 the first predetermined conversion factor is regulated by modifying a resistance of the coefficient resistor.

4. The trans-conductance regulation circuit of claim 2, wherein the current output module comprises:

a second transistor and a third transistor, each having a gate, a source and a drain, wherein the second transistor and the third transistor are configured to form a current mirror; and wherein
 the source of the second transistor and the source of the third transistor are coupled to an internal supply voltage, and wherein the drain and the gate of the second transistor are coupled together to receive the first current, and wherein the gate of the third transistor is coupled to the gate of the second transistor, and wherein the drain of the third transistor is configured to provide the bias current; and wherein
 the second predetermined conversion factor is regulated by modifying a ratio of a channel width to length ratio of the third transistor to a channel width to length ratio of the second transistor.

5. The trans-conductance regulation circuit of claim 2, wherein the conversion module comprises:
 a coefficient resistor having a first terminal and a second terminal, wherein the first terminal of the coefficient resistor is configured to receive the output voltage;
 a fourth transistor having a gate, a source and a drain, wherein the gate and the drain of the fourth transistor are coupled together, the drain of the fourth transistor is coupled to the second terminal of the coefficient resistor and the source of the fourth transistor is coupled to a reference ground; and
 a fifth transistor having a gate, a source and a drain, wherein the gate of the fifth transistor is coupled to the gate of the fourth transistor, the source of the fifth transistor is coupled to the reference ground, and the drain of the fifth transistor is configured to provide the first current; and wherein
 the first predetermined conversion factor is regulated by modifying a resistance of the coefficient resistor and/or a ratio of a channel width to length ratio of the fifth transistor to a channel width to length ratio of the fourth transistor.

6. The trans-conductance regulation circuit of claim 1, further comprising:
 a second input terminal configured to receive a feedback signal indicative of the output voltage; wherein
 the voltage to current conversion circuit is configured to provide a first current based on a difference between the output voltage and the feedback signal, and further configured to provide a second current based on the feedback signal, and further configured to generate the bias current through canceling a fraction of the first current which is related to the feedback signal by the second current.

7. The trans-conductance regulation circuit of claim 6, wherein the voltage to current conversion circuit comprises:
 a first conversion module having a first conversion input terminal, a second conversion input terminal and a conversion output terminal, wherein the first conversion input terminal is configured to receive the output voltage, and the second conversion input terminal is configured to receive the feedback signal, and wherein the first conversion module is configured to convert a difference between the output voltage and the feedback signal to the first current with a third predetermined conversion factor;
 a second conversion module having a conversion input terminal configured to receive the feedback signal and a conversion output terminal configured to provide the second current, wherein the second conversion module is configured to convert the feedback signal into the second current with a fourth predetermined conversion factor, and wherein the fourth predetermined conversion factor is set equal to the third predetermined conversion factor; and a current output module configured to respectively receive the first current from the first conversion module and the second current from the second conversion module, and to superpose the first current with the second current to generate the bias current.

8. The trans-conductance regulation circuit of claim 7, wherein the first conversion module comprises:

an operational amplifier, a sixth transistor, a seventh transistor and a coefficient resistor, wherein the operational amplifier has a non-inverted input terminal, an inverted input terminal and an output terminal, and wherein each of the sixth transistor and the seventh transistor has a gate, a source and a drain, and wherein the coefficient resistor has a first terminal and a second terminal; and wherein the first terminal of the coefficient resistor is configured to receive the output voltage of the power converter, the second terminal of the coefficient resistor is coupled to the non-inverted input terminal of the operational amplifier; and wherein the inverted input terminal of the operational amplifier is configured to receive the feedback signal; and wherein the gate of the sixth transistor is coupled to the output terminal of the operational amplifier, the drain of the sixth transistor is coupled to the non-inverted input terminal of the operational amplifier, and the source of the sixth transistor is coupled to a reference ground; and wherein the gate of the seventh transistor is coupled to the gate of the sixth transistor, the source of the seventh transistor is coupled to the reference ground and the drain of the seventh transistor is configured to provide the first current; and wherein the third predetermined conversion factor is regulated by modifying a resistance of the coefficient resistor.

9. The trans-conductance regulation circuit of claim 7, wherein the second conversion module comprises a second coefficient resistor, an eighth transistor and a ninth transistor, wherein the second coefficient resistor has a first terminal and a second terminal, and wherein each of the eighth transistor and the ninth transistor has a gate, a source and a drain; and wherein the first terminal of the second coefficient resistor is configured to receive the feedback signal, the second terminal of the second coefficient resistor is coupled to the drain of the eighth transistor; and wherein the drain and the gate of the eighth transistor are coupled together, and the source of the eighth transistor is coupled to a reference ground; and wherein the gate of the ninth transistor is coupled to the gate of the eighth transistor, the source of the ninth transistor is coupled to the reference ground, and the drain of the ninth transistor is configured to provide the second current; and wherein the fourth predetermined conversion factor is regulated by modifying a resistance of the second coefficient resistor and/or a ratio of a channel width to length ratio of the ninth transistor to a channel width to length ratio of the eighth transistor.

10. The trans-conductance regulation circuit of claim 7, wherein the current output module comprises:

a second transistor and a third transistor, each having a gate, a source and a drain, wherein the second transistor and the third transistor are configured to form a current mirror; and wherein the source of the second transistor and the source of the third transistor are coupled to an internal supply voltage, and wherein the drain and the gate of the second transistor are coupled together to receive the first current and the second current, and wherein the gate of the third transistor is coupled to the gate of the second transistor, and wherein the drain of the third transistor is configured to provide the bias current.

11. A trans-conductance error amplifier module for a power converter, wherein the power converter is configured to convert an input voltage into an output voltage, the trans-conductance error amplifier module comprising:

a trans-conductance operational amplifier having a bias current input terminal configured to receive a bias current and a trans-conductance determined by a ratio of the bias current to a substantially constant thermal voltage; and a trans-conductance regulation circuit having a first input terminal configured to receive the output voltage of the power converter and an output terminal configured to provide the bias current to the trans-conductance operational amplifier, wherein the trans-conductance regulation circuit is configured to convert the output voltage to the bias current with a predetermined conversion factor.

12. The trans-conductance error amplifier module of claim 11, wherein the trans-conductance regulation circuit comprises:

a conversion module configured to receive the output voltage and to convert the output voltage into a first current with a first predetermined conversion factor, wherein the first current is configured to flow from outside to inside of the conversion module; and a current output module configured to receive the first current and to convert the first current into the bias current with a second predetermined conversion factor, wherein the bias current is configured to flow from inside to outside of the current output module.

13. The trans-conductance error amplifier module of claim 11, wherein the trans-conductance regulation circuit further has a second input terminal configured to receive a feedback signal indicative of the output voltage; and wherein the trans-conductance regulation circuit is configured to provide a first current based on a difference between the output voltage and the feedback signal, and further configured to provide a second current based on the feedback signal, and further configured to generate the bias current through canceling a fraction of the first current which is related to the feedback signal by the second current.

14. The trans-conductance error amplifier module of claim 13, wherein the trans-conductance regulation circuit comprises:

a first conversion module having a first conversion input terminal, a second conversion input terminal and a conversion output terminal, wherein the first conversion input terminal is configured to receive the output voltage, and the second conversion input terminal is configured to receive the feedback signal, and wherein the first conversion module is configured to convert a difference between the output voltage and the feedback signal to the first current with a third predetermined conversion factor;

a second conversion module having a conversion input terminal configured to receive the feedback signal and a conversion output terminal configured to provide the second current, wherein the second conversion module is configured to convert the feedback signal into the second current with a fourth predetermined conversion factor, and wherein the fourth predetermined conversion factor is set equal to the third predetermined conversion factor; and a current output module configured to respectively receive the first current from the first conversion module and the second current from the second conversion module, and to superpose the first current with the second current to generate the bias current.

15. A power converter, comprising:

an input port configured to receive an input voltage;

an output port configured to provide an output voltage;

a switch module configured to switch on and off in response to a control signal to convert the input voltage to the output voltage, wherein a switching current flows through the switch module during the on and off switching of the switch module; and a control module configured to respectively receive a feedback signal indicative of the output voltage, a first reference signal indicative of a desired value of the output voltage and a sensing signal indicative of the switching current, and configured to generate an amplified difference signal indicative of a difference between the feedback signal and the first reference signal, and further configured to compare the amplified difference signal with the sensing signal so as to generate the control signal at least partially based on the comparison of the amplified difference signal with the sensing signal; wherein the control module comprises:

a trans-conductance operational amplifier having a first amplifier input terminal, a second amplifier input terminal, a bias current input terminal and an amplifier output terminal, wherein the first amplifier input terminal is configured to receive the feedback signal, the second amplifier input terminal is configured to receive the first reference signal, the bias current input terminal is configured to receive a bias current and the amplifier output terminal is configured to provide the amplified difference signal; and wherein the trans-conductance operational amplifier has a trans-conductance determined by a ratio of the bias current to a substantially constant thermal voltage; and a trans-conductance regulation circuit having a first input terminal configured to receive the output voltage of the power converter and an output terminal configured to provide the bias current to the trans-conductance operational amplifier, wherein the trans-conductance regulation circuit is configured to convert the output voltage to the bias current with a predetermined conversion factor.

* * * * *